United States Patent
Brodnick

(10) Patent No.: US 6,549,423 B1
(45) Date of Patent: Apr. 15, 2003

(54) MEDICAL DEVICE HAVING A SIDE LOADING BATTERY COMPARTMENT

(75) Inventor: Donald E. Brodnick, Cedarburg, WI (US)

(73) Assignee: GE Medical Systems Information Technologies, Inc., Milwaukee, WI (US)

(*) Notice: Subject to any disclaimer, the term of this patent is extended or adjusted under 35 U.S.C. 154(b) by 0 days.

(21) Appl. No.: 09/683,076

(22) Filed: Nov. 15, 2001

(51) Int. Cl.⁷ .......................... H05K 7/14; H01M 2/02
(52) U.S. Cl. .................. 361/798; 361/814; 429/99; 429/100; 429/96
(58) Field of Search .................. 361/798, 814, 361/726; 600/300, 509, 523, 386, 390; 128/903; 429/96, 98–100; 206/703–705

(56) References Cited

U.S. PATENT DOCUMENTS

| | | | | |
|---|---|---|---|---|
| 4,641,370 A | * | 2/1987 | Oyamada | ................... 455/348 |
| 5,337,215 A | * | 8/1994 | Sunderland et al. | ........ 361/726 |
| 5,471,667 A | | 11/1995 | Yamada | |
| 5,506,749 A | * | 4/1996 | Matsuda | ..................... 361/683 |
| 5,633,096 A | * | 5/1997 | Hattori | .......................... 429/7 |
| 5,744,930 A | * | 4/1998 | Fleming et al. | ................. 320/2 |
| 6,007,941 A | * | 12/1999 | Hermann et al. | ............. 429/99 |

* cited by examiner

Primary Examiner—David Martin
Assistant Examiner—Dameon E. Levi
(74) Attorney, Agent, or Firm—Michael Best & Friedrich LLP

(57) ABSTRACT

The invention provides an electronic device including a housing having a plurality of sidewalls defining a generally rectangular cavity within the housing to support therein a predetermined number of generally cylindrical batteries. One of the sidewalls defines an aperture extending through the sidewall and opening into the cavity. A support member is mounted in the housing and includes a support portion extending into the cavity to support inserted batteries in a position transverse to at least one of the sidewalls until all of the predetermined number of batteries are inserted into the cavity.

25 Claims, 3 Drawing Sheets

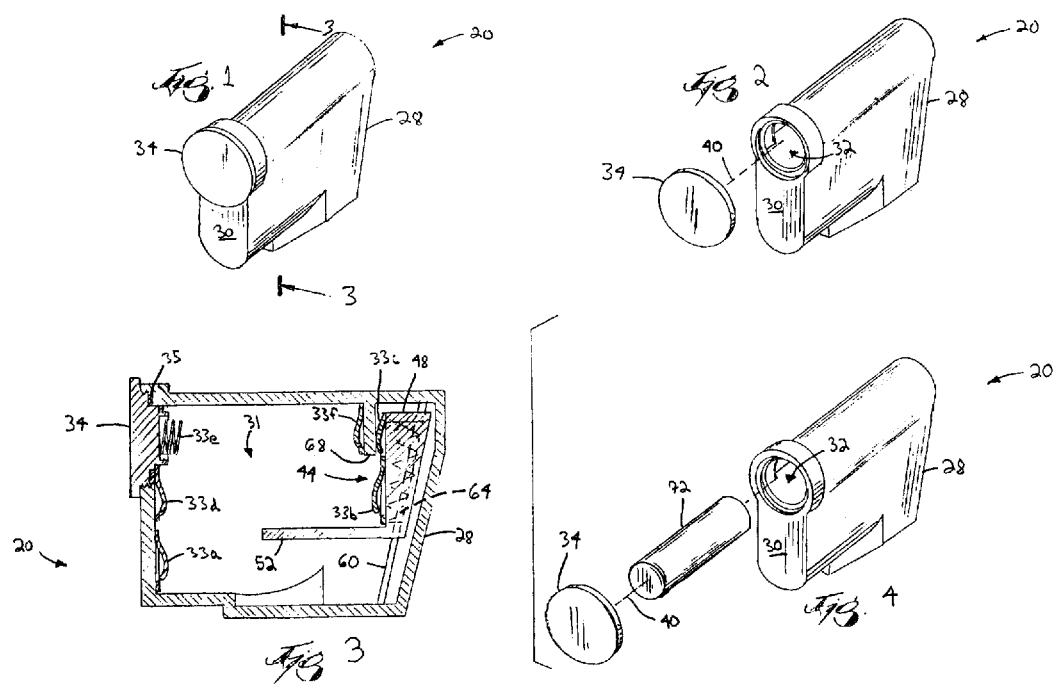

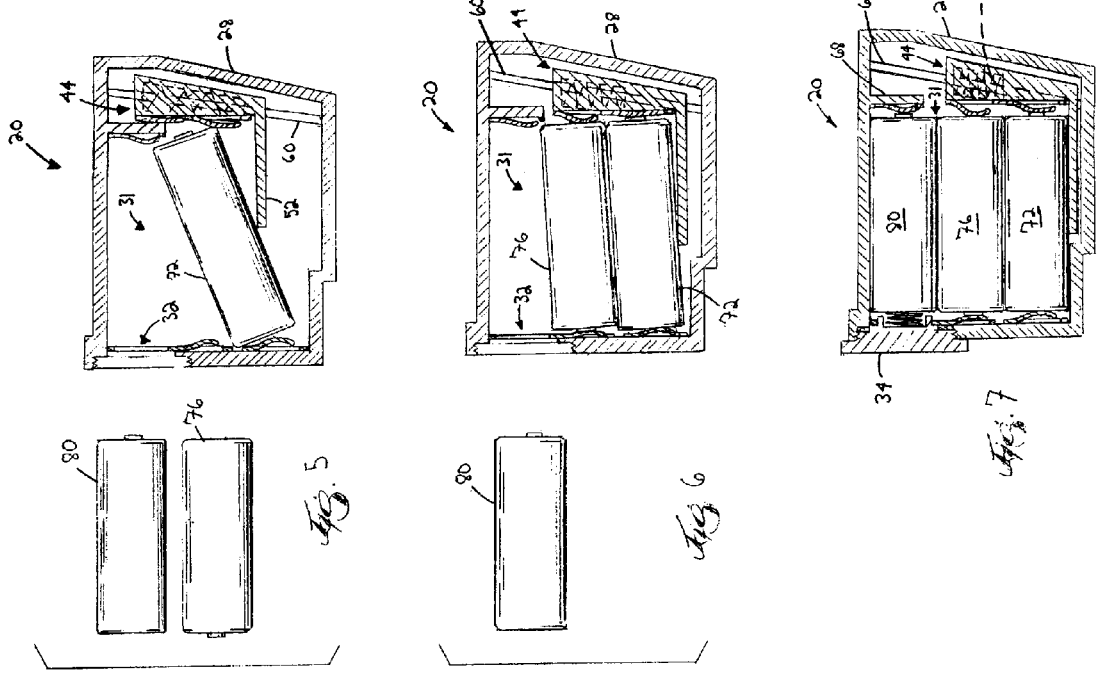

MEDICAL DEVICE HAVING A SIDE LOADING BATTERY COMPARTMENT

BACKGROUND OF THE INVENTION

This invention relates to battery compartments for electronic medical devices and more particularly to side loading battery compartments having a single round loading aperture for such devices. Because of the environments in which they are used, electronic medical devices must have housings that are sealed against the intrusion of fluids into the housing. Should fluid ingress into the housing, the electronics supported therein could be irreparably damaged. Often, these electronic devices are battery operated.

Battery compartments in such devices require a battery door to close and seal the battery compartment. Typically these compartments have one of two shapes; an elongated tubular shape, or a rectangular shape. Battery compartments having a tubular shape and a round loading aperture can easily be made liquid proof by sealing the loading aperture with a screw cap. Unfortunately, the long thin tubular shaped battery compartments are undesirable in many small electronic packages. Rectangular compartments are easier to incorporate into these devices because they typically match the shape of the housing. However, rectangular compartments are difficult to seal. Typically the rectangular door is snapped or screwed into place over the battery loading aperture, which makes it difficult to effectively seal the entire perimeter between the door and the loading aperture.

SUMMARY OF THE INVENTION

Accordingly, the invention provides an electronic device including a housing having a plurality of sidewalls defining a generally rectangular cavity within the housing to support therein a predetermined number of generally cylindrical batteries. One of the sidewalls defines an aperture extending through the sidewall and opening into the cavity. A support member is mounted in the housing and includes a support portion extending into the cavity to support inserted batteries in a position transverse to at least one of the sidewalls until all of the predetermined number of batteries are inserted into the cavity.

According to another aspect, the invention provides an electronic device including a housing having a plurality of sidewalls defining a generally rectangular cavity within the housing to support therein a plurality of generally cylindrical batteries. One of the sidewalls defines a single generally round aperture extending through the sidewall. The aperture opens into the cavity, and a round sealing member dimensioned to fit within the aperture is inserted into the aperture to enclose and seal the cavity.

According to yet another aspect, the invention provides a support member for supporting batteries in a battery pack having a generally rectangular housing. The support member includes a base portion adapted to be slidably mounted in the housing for movement relative to the housing between first and second positions, a lip connected to the base portion for at least partially supporting batteries in the housing at least temporarily in a position transverse to a sidewall of the housing, a conducting member connected to the base portion, and a spring assembly connected to the support member to bias the support member toward the first position.

It is an advantage of the invention to provide a new and improved sealed battery compartment for an electronic device.

It is another advantage of the invention to provide an electronic device for supporting batteries in a sealed rectangular aperture.

A further advantage of the invention is to provide an electronic device for supporting batteries that has a round sealing member to enclose a battery loading aperture in the electronic device.

Still another advantage of the invention is to provide a support member for supporting batteries in a battery pack.

Other features and advantages of the invention are set forth in the attached drawings, detailed description and claims.

BRIEF DESCRIPTION OF THE DRAWINGS

FIG. 1 is a perspective view of an electrical device embodying the invention.

FIG. 2 is an exploded perspective view of the electrical device in FIG. 1.

FIG. 3 is a section view of the electrical device taken along line 3—3 in FIG. 1.

FIG. 4 is an exploded perspective view of the electrical device embodying the invention showing a battery being inserted therein.

FIG. 5 is a section view similar to FIG. 3 and showing a first battery inserted therein.

FIG. 6 is a section view similar to FIG. 3 and showing the first and a second batteries inserted therein.

FIG. 7 is a section view similar to FIG. 3 and showing three batteries inserted therein.

DETAILED DESCRIPTION

Figure 8:
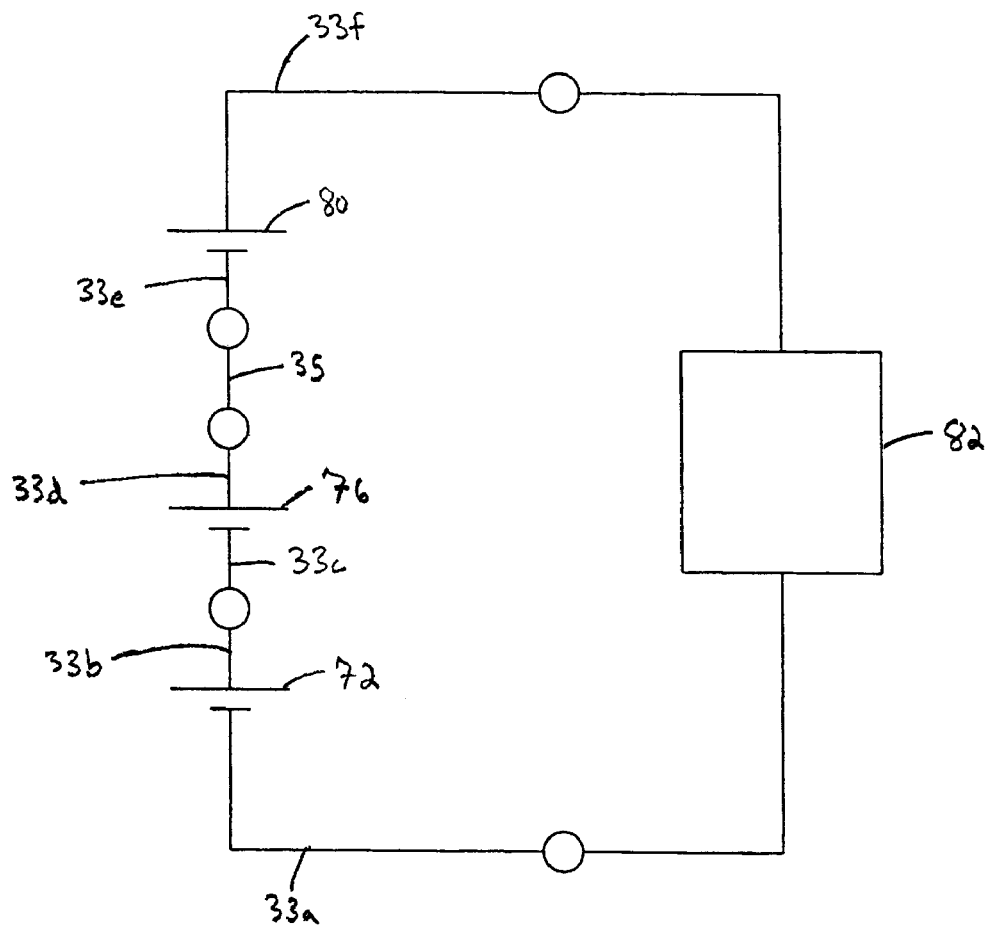
FIG. 8 is an electrical schematic of the electrical device showing the battery contacts.

Before any embodiments of the invention are explained, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting. The use of including, comprising, or having and variations thereof herein is meant to encompass the items listed thereafter and equivalents thereof as well as additional items.

FIG. 1 illustrates an electrical device 20 embodying the invention. In the preferred embodiment, the device 20 is a self-contained, battery operated medical device such as a Holter monitor, or telemetry-based patient monitoring transmitter. However, the invention is applicable to any battery operated electrical device. The electrical device 20 includes a generally rectangular housing 28. The housing 28 includes at least one sidewall 30 defining a cavity 31 (see FIG. 3) for holding first, second, and third batteries 72, 76, and 80 (see FIG. 7), and for holding conducting members 33a, 33b, 33c, 33d, and 33f (see FIG. 3) to electrically connect the batteries 72, 76, 80 in series, and transfer electrical power from the batteries 72, 76, 80 to an electrically powered machine or apparatus 82 (shown schematically in FIG. 8), also preferably enclosed within the housing 28. Contact members 33b and 33c are preferably formed from a single piece of metal or other electrically conductive material so that they are electrically connected to each other.

Referring to FIG. 2, the sidewall 30 also defines a circular opening 32 extending through the sidewall 30 and communicating with the cavity 31. The device 20 includes a sealing member 34 that fits within the circular opening 32 to close and seal the cavity 31.

In the preferred embodiment, the sidewall 30 defining the opening 32 is threaded, and the sealing member 34 is threaded into the opening 32 along an insertion axis 40 to seal the housing 28. The sealing member 34 includes a spring contact 33e and a contact member 35 connected to the spring contact 33e so that when the sealing member 34 is inserted in place in opening 32, contact member 33d is electrically connected to spring contact 33e. In other embodiments, the sealing member 34 can be inserted into the opening 32 along the axis 40 and frictionally engages the housing 28 surrounding the opening 32 to seal the housing 28. In such a construction, a second sealing member (not shown), such as, for example, an O-ring or a gasket, mounts to the sealing member 34 and frictionally engages the housing 28 in a position between the sealing member 34 and the housing 28 to seal the housing 28, such that liquid cannot penetrate past the second sealing member and enter into the housing 28. In another embodiment, the second sealing member is mountable to the housing 28 in a position between the housing 28 and the sealing member 34, such that liquid cannot penetrate past the second sealing member and enter into the housing 28.

Referring to FIG. 3, the electrical device 20 includes a base portion or support member 44 slidably supported by the housing 28. As viewed in the orientation shown in FIG. 3, the support member 44 has a generally upright portion 48 and a generally horizontal lip or support portion 52 that extends into the cavity 31 defined by the housing 28. The electrical device 20 also includes a track 60 that is mounted to the housing 28. The support member 44 is slidably mounted to the track 60 and can slide between a first position and a second position. In the preferred construction, the track 60 is angled, so that the support member 44 moves to the left (as shown in FIG. 3) as the support member 44 slides down and so that the support member 44 moves to the right (as shown in FIG. 3) as the support member 44 slides up. The support member 44 is in the first position at the top of the track 60 (see FIG. 3) and in the second position at the bottom of the track 60 (see FIG. 7). The electrical device 20 optionally includes a biasing member 64 supported between the housing 28 and the support member 44. The biasing member 64 biases the support member 44 toward the first position (as seen in FIG. 3).

The electrical device 20 also includes a battery stop 68 that is supported by the housing 28 and protrudes into the cavity 31. The battery stop 68 limits the insertion of batteries 72, 76, 80 into the cavity 31.

Referring to FIG. 4, the electrical device 20 and the first battery 72 are illustrated. The first battery 72 inserts into the cavity 31 of the electrical device 20 through the opening 32 along the insertion axis 40. The second and third batteries 76 and 80 are inserted likewise. After the batteries 72, 76, 80 are inserted into the cavity 31, the sealing member 34 is threaded into the housing 28 to seal the housing 28.

Referring to FIG. 5, the electrical device 20 is illustrated with the first battery 72 inserted through the opening 32 and into the cavity 31. The first battery 72 rests on the support portion 52 transverse to the insertion axis 40 and biases the support member 44 slightly downward along the track 60.

Referring to FIG. 6, the electrical device 20 is illustrated with the first and second batteries 72 and 76 inserted through the opening 32 and into the cavity 31. The second battery 76 rests on top of the first battery 72 and biases the support member 44 downward along the track 60, further than the first battery 72 alone. Both the first and second batteries 72 and 76 rest transversely to the insertion axis 40.

As described above and illustrated in FIGS. 5 and 6, the batteries 72 and 76 self-orient themselves as a result of gravity so that they rest upon the support portion 52 after insertion. If the electrical device 20 is in a different orientation with respect to the gravitational field, or is being used in a weightless environment such as outer space, the batteries 72 and 76 can be moved clear of the opening 32 and toward the support portion 52 by other means, such as, but not limited to shaking, accelerating, or jerking the electrical device 20.

Referring to FIG. 7., the electrical device 20 is illustrated with the first, second, and third batteries 72, 76, and 80 inserted through the opening 32 and into the cavity 31. As the third battery 80 is inserted through the opening 32 and into the cavity 31, the third battery 80 contacts the transversely aligned second battery 76. The third battery 80 biases the first and second batteries 72 and 76 downward against the support member 44 and biasing member 64. The biasing member 64 exerts a force on the support member 44 and is chosen such that the force exerted by the third battery 80 upon insertion into the cavity 31, easily overcomes the force exerted by the biasing member 64 on the support member 44. The force exerted by the biasing member 64 is also chosen to be light enough so that a pinch force exerted on the third battery 80 is easily overcome by gravity or a gentle tap when the batteries 72, 76, 80 are removed from the electrical device 20. The pinch force is the force exerted by the biasing member 44 on the batteries 72, 76, 80 upon the insertion of the first, second, and third batteries 72, 76, and 80 into the cavity 31. The third battery 80 is pushed into the cavity 31 until contact is made with the battery stop 68, at which point, the first, second, and third batteries 72, 76, and 80 are aligned generally parallel to the insertion axis 40 and the support member 44 is at the bottom of the track 60 in the second position. The sealing member 34 is threaded into the housing 28 and seals the batteries 72, 76, 80 in the electrical device 20.

The embodiments described above and illustrated in the figures are presented by way of example only and not intended as a limitation upon the concepts and principles of the present invention. As such, it will be appreciated by one having ordinary skill in the art that various changes in the elements and their configuration and arrangement are possible without departing from the spirit and scope of the present invention.

Various features of the invention are set forth in the following claims.

What is claimed is:

1. An electronic device comprising:
   a housing including a plurality of sidewalls defining a generally rectangular cavity within the housing to support therein a plurality of generally cylindrical batteries, one of the sidewalls defining an aperture extending through the sidewall and opening into the cavity; and
   a support member mounted in the housing and including a support portion extending into the cavity to support inserted batteries in a position transverse to at least one of the sidewalls until all of the batteries are inserted into the cavity.

2. An electronic device as set forth in claim 1, wherein the aperture is a round aperture.

3. An electronic device as set forth in claim 1, and further comprising a sealing member dimensioned to fit within the aperture to enclose and seal the cavity.

4. An electronic device as set forth in claim 3, wherein the sealing member includes a biasing member, the biasing member being supportable by the sealing member and being operable to compress at least one of the predetermined number of generally cylindrical batteries into the cavity.

5. An electronic device as set forth in claim 4, wherein the biasing member is electrically conductive for electrically connecting two of the predetermined number of generally cylindrical batteries.

6. An electronic device as set forth in claim 3, further comprising a second sealing member supported by the housing, the second sealing member positionable around the aperture and being operable to create a water tight seal between the sealing member and the housing upon the sealing member enclosing the cavity.

7. An electronic device as set forth in claim 6, wherein the second sealing member is an O-ring.

8. An electronic device as set forth in claim 6, wherein the second sealing member is a gasket.

9. An electronic device as set forth in claim 1, wherein the support member is slidably mounted on the housing for movement between a first and second position.

10. An electronic device as set forth in claim 1, wherein the housing includes a track for supporting the support member for sliding movement between a first and second position.

11. An electronic device as set forth in claim 10, wherein the track is generally angled.

12. An electronic device as set forth in claim 10, wherein the track is generally straight.

13. An electronic device as set forth in claim 1, wherein the support member is electrically conductive for electrically connecting two of the plurality of generally cylindrical batteries.

14. An electronic device as set forth in claim 1, further comprising a biasing member mounted in the housing and being operable to bias the support member between a first and second position.

15. A support member for supporting batteries in a battery pack having a generally rectangular housing, the support member comprising:

a base portion adapted to be slidably mounted in the housing for movement relative to the housing between first and second positions;

a lip connected to the base portion for at least partially supporting batteries in the housing at least temporarily in a position transverse to a sidewall of the housing;

a conducting member connected to the base portion; and a spring assembly connected to the support member to bias the support member toward the first position.

16. An electronic device comprising:

a housing including a plurality of sidewalls defining a generally rectangular cavity within the housing to support therein a plurality of generally cylindrical batteries, one of the sidewalls defining a single generally round aperture extending through the sidewall and opening into the cavity;

a round sealing member dimensioned to fit within the aperture to enclose and seal the cavity; and a support member, the support member mounted in the housing and including a support portion extending in the cavity to support inserted batteries in a position transverse to at least one of the sidewalls until all of the plurality of generally cylindrical batteries are inserted into the cavity.

17. An electronic device as set forth in claim 16, wherein the round sealing member includes a biasing member, the biasing member being supportable by the round sealing member and being operable to compress at least one of the plurality of generally cylindrical batteries into the cavity.

18. An electronic device as set forth in claim 17, wherein the biasing member is electrically conductive for electrically connecting two of the plurality of generally cylindrical batteries.

19. An electronic device as set forth in claim 16, further comprising a second sealing member supported by the housing, the second sealing member positionable around the round aperture and being operable to create a water tight seal between the round sealing member and the housing.

20. An electronic device as set forth in claim 16, wherein the support member is slidably mounted on the housing for movement between a first and second position.

21. An electronic device as set forth in claim 16, wherein the housing includes a track for supporting the support member for sliding movement between a first and second position.

22. An electronic device as set forth in claim 21, wherein the track is generally angled.

23. An electronic device as set forth in claim 21, wherein the track is generally straight.

24. An electronic device as set forth in claim 16, wherein the support member is electrically conductive for electrically connecting two of the plurality of generally cylindrical batteries.

25. An electronic device as set forth in claim 16, further comprising a biasing member mounted in the housing and being operable to bias the support member between a first and second position.

* * * * *